(12) United States Patent
Hu

(10) Patent No.: US 9,439,281 B2
(45) Date of Patent: Sep. 6, 2016

(54) METHOD FOR MANUFACTURING PRINTED CIRCUIT BOARD

(71) Applicant: Zhen Ding Technology Co., LTd., Tayuan, Taoyuan (TW)

(72) Inventor: Wen-Hung Hu, Taoyuan (TW)

(73) Assignee: Zhen Ding Technology Co., Ltd., Tayuan, Taoyuan (TW)

( * ) Notice: Subject to any disclaimer, the term of this patent is extended or adjusted under 35 U.S.C. 154(b) by 510 days.

(21) Appl. No.: 13/947,114

(22) Filed: Jul. 22, 2013

(65) Prior Publication Data

US 2014/0060902 A1  Mar. 6, 2014

(30) Foreign Application Priority Data

Aug. 29, 2012  (CN) .................. 2012 1 03120006

(51) Int. Cl.
| | |
|---|---|
| H05K 1/09 | (2006.01) |
| H05K 1/02 | (2006.01) |
| H05K 3/00 | (2006.01) |
| H05K 3/46 | (2006.01) |
| H05K 3/18 | (2006.01) |
| H05K 3/42 | (2006.01) |

(52) U.S. Cl.
CPC ............ *H05K 1/0296* (2013.01); *H05K 3/007* (2013.01); *H05K 3/4661* (2013.01); *H05K 3/185* (2013.01); *H05K 3/422* (2013.01); *H05K 2203/107* (2013.01)

(58) Field of Classification Search
CPC .......... H05K 1/00; H05K 3/34; H05K 3/287; H05K 3/0023; H05K 3/3484; B23K 35/26; B23K 35/262; G03F 7/20; G03F 7/038; B09C 1/10
USPC ................ 174/257, 250; 435/262.5; 148/24; 430/319
See application file for complete search history.

(56) References Cited

FOREIGN PATENT DOCUMENTS

| TW | 200633089 A | 9/2006 |
|---|---|---|
| TW | 200637449 A | 10/2006 |
| TW | 201110842 A1 | 3/2011 |

*Primary Examiner* — Tremesha S Willis
(74) *Attorney, Agent, or Firm* — Zhigang Ma

(57) ABSTRACT

A printed circuit board includes a base, a number of conductive pads, a dielectric layer, an activated metal layer, a first metal seed layer, a second metal seed layer, and a plurality of metal bumps. The conductive pads are formed on the base. The dielectric layer is formed on a surface of the conductive pads and portions of the base are exposed from the conductive pads. The dielectric layer includes blind vias corresponding to the conductive pads, and a laser-activated catalyst. The activated metal layer is obtained by laser irradiation at the wall of the blind via. The activated metal layer is in contact with the dielectric layer. The second metal seed layer is formed on the activated metal layer and the conductive pads. Each metal bump is formed on the second metal seed layer, and each metal bump protrudes from the dielectric layer.

9 Claims, 13 Drawing Sheets

METHOD FOR MANUFACTURING PRINTED CIRCUIT BOARD

BACKGROUND

1. Technical Field

The present disclosure generally relates to printed circuit boards (PCBs), and particularly relates to a printed circuit board and a method for manufacturing the printed circuit board.

2. Description of Related Art

To accommodate development of miniaturized electronic products with multiple functions, printed circuit boards are widely used.

A PCB usually needs a plurality of blind vias for electrically connecting two trace layers or more than two trace layers. In a method of manufacturing the PCB, a dielectric layer is laminated on a circuit substrate with at least one pad, and at least one first opening is defined in the dielectric layer by laser. Each first opening corresponds to one pad. Then, a photoresist pattern is formed on the dielectric layer, and at least one second opening is defined in the photoresist pattern by exposing and developing process. Each second opening must be aligned with a corresponding first opening. Finally, conductive metal material is formed in the first and second openings, thus, a blind via are formed. In order to easily achieve the alignment and each first opening is entirely exposed at the corresponding second opening, the second opening is larger than the first openings. Accordingly, a distribution density of the second openings is smaller, and a distribution density of the teace is also smaller.

What is needed therefore is a printed circuit board, and a method for manufacturing the printed circuit board to overcome the described limitations.

BRIEF DESCRIPTION OF THE DRAWINGS

Many aspects of the present embodiments can be better understood with reference to the following drawings. The components in the drawings are not necessarily drawn to scale, the emphasis instead being placed upon clearly illustrating the principles of the present embodiments. Moreover, in the drawings, all the views are schematic, and like reference numerals designate corresponding parts throughout the several views.

DETAILED DESCRIPTION

A method for manufacturing a printed circuit board includes the following steps.

Figure 1:
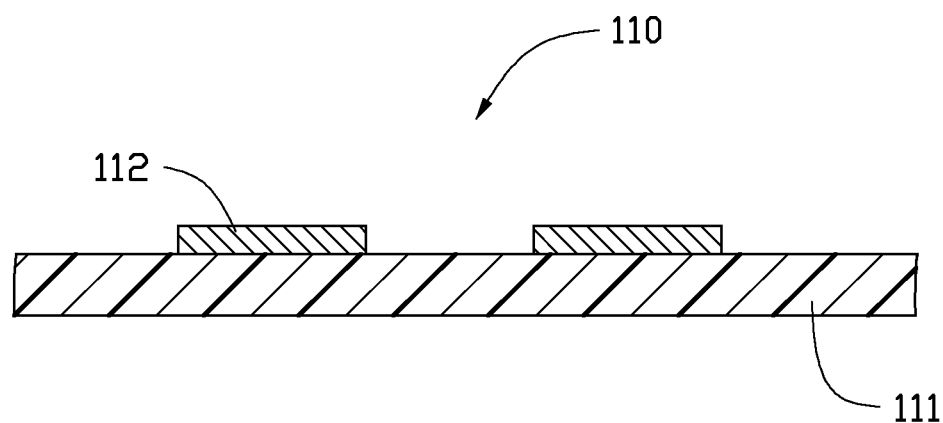
FIG. 1 shows a circuit substrate according to an exemplary embodiment.

FIG. 1 shows step 1, in which a circuit substrate 110 is provided. The circuit substrate 110 includes a base 111 and a number of conductive pads 112. The circuit substrate 110 may be a single layer circuit substrate, or a multilayer circuit substrate. When the circuit substrate 110 is a single layer circuit substrate, the base 111 is a single layer dielectric base. When the circuit substrate 110 is a multilayer circuit substrate, the base 111 is a stacked structure, in which a plurality of electrically conductive circuit patterns and a plurality of dielectric layers are stacked alternately. The conductive pads 112 contact a dielectric layer base or a dielectric layer. In the present embodiment, the conductive pads 112, which are arranged in an array.

Figure 2:
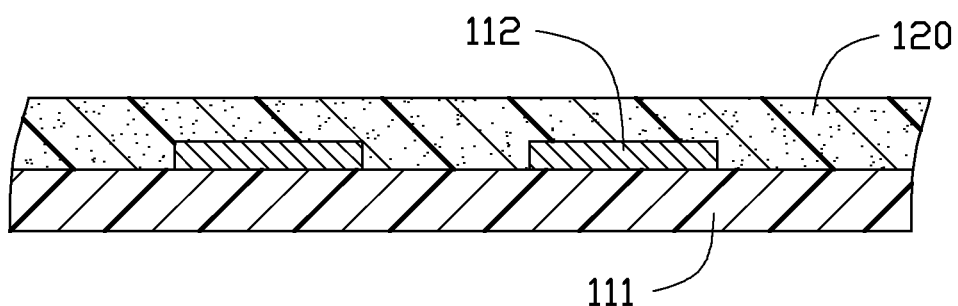
FIG. 2 shows a dielectric layer formed on the circuit substrate of FIG. 1.

FIG. 2 shows step 2, in which a dielectric layer 120 is formed on a surface of the conductive pads 112 and a surface of the base 111 exposed from the conductive pads 112. In the present embodiment, the dielectric layer 120 is formed by printing with ink, exposing the ink, and developing the ink. The ink includes a laser-activated catalyst. The laser-activated catalyst is converted into an electrically conductive material by laser irradiation, such that an electro-less copper plating can be directly processed in the following step. A mass percent of the laser-activated catalyst in the solder resist ink is in a range from 0.1% to 30%, preferably from 0.5% to 10%. The laser-activated catalyst may be heavy metal mixture oxide spinel such as, for example, copper-chromium oxide spinel. The laser-activated catalyst may be metal salt, for example, copper sulfate or cupric rhodanate.

Figure 3:
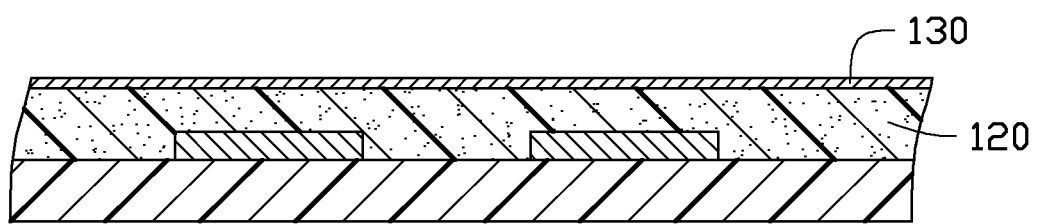
FIG. 3 shows a first metal seed layer formed on the dielectric layer of FIG. 2.

FIG. 3 shows step 3, in which a first metal seed layer 130 is formed on a surface of the dielectric layer 120. The first metal seed layer 130 may be formed by a sputtering or electro-less plating process. A material of the first metal seed layer 130 may be titanium, nickel, vanadium, copper, lead, aluminium alloy, tungsten, tungsten alloy, chromium, chromium alloy, silver, or gold, for example.

Figure 4:
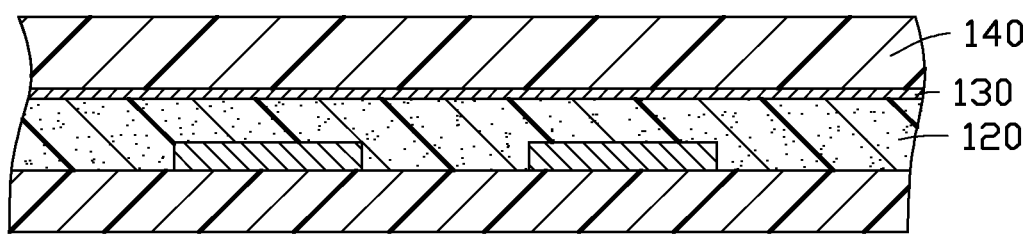
FIG. 4 shows a photoresist layer formed on the first metal seed layer of FIG. 3.
Figure 5:
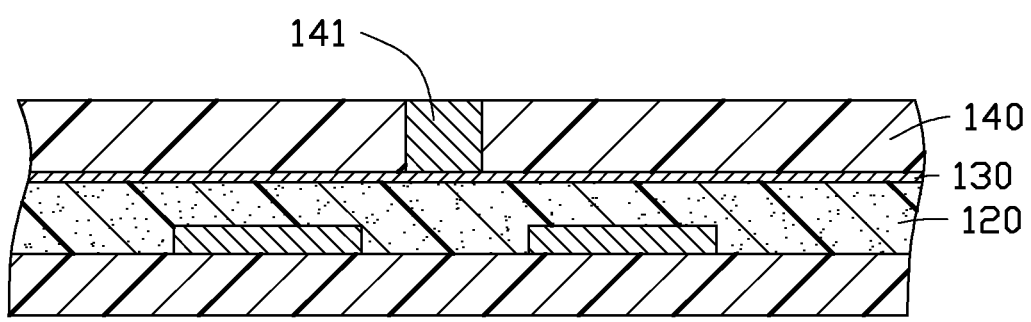
FIG. 5 shows a trace portion of the photoresist layer of FIG. 3 being exposed.

FIGS. 4 and 5 show step 4, in which a photoresist layer 140 is formed on the first metal seed layer 130, the photoresist layer 140 includes a trace portion 141 corresponding with traces to be formed in the following step. The trace portion 141 of the photoresist layer 140 is exposed.

In the present embodiment, the photoresist layer 140 is formed by laminating a dry film on the first metal seed layer 130. When the trace portion 141 of the photoresist layer 140 being exposed, a chemical reaction is generated in material of the trace portion 141 of the photoresist layer 140, thus, the material of the trace portion 141 can be removed using a developing process.

Figure 6:
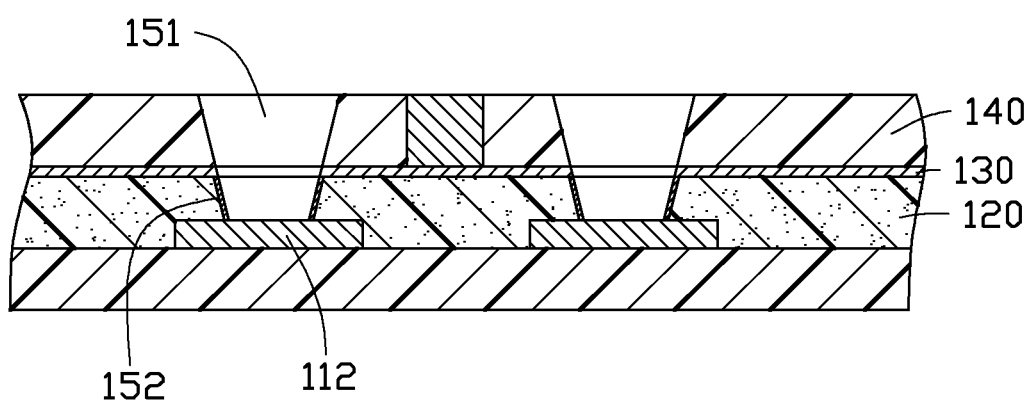
FIG. 6 shows a number of blind vias formed in the photoresist layer, the first metal seed layer, and the dielectric layer, and activated metal layers formed on the inner sidewalls of the blind vias of FIG. 5, which are in the dielectric layer.
Figure 7:
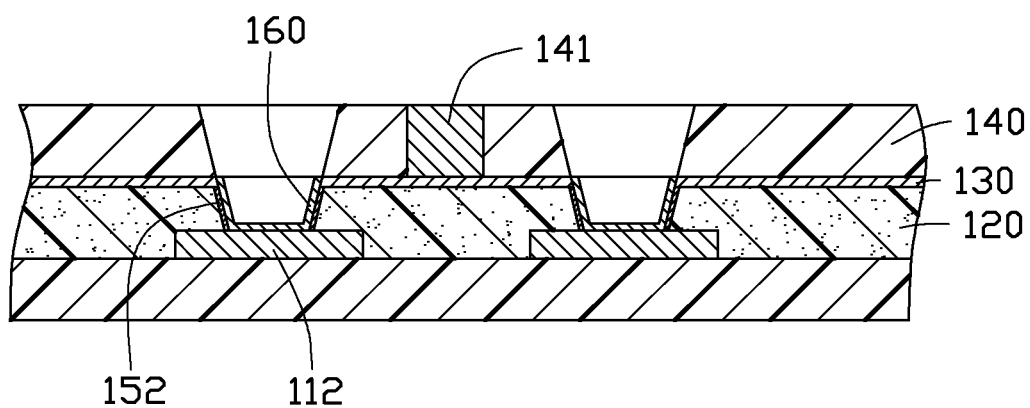
FIG. 7 shows a second metal seed layer formed on the activated metal layer of FIG. 6.

FIG. 6 shows step 5, in which a plurality of blind vias 151 are defined in the photoresist layer 140, the first metal seed layer 130, and the solder mask 120. The blind vias 151 spatially correspond to the conductive pads 112. Each conductive pad 112 is exposed in one blind via 115. In addition, under laser action, the laser-activated catalyst at the wall of a blind via 151, which is in the solder mask 120, is activated, thereby obtaining an activated metal layer 152. The activated metal layer 152 electrically connects the first metal seed layer 130 and the electrically conductive pad 112.

FIG. 6 shows step 7, in which a second metal seed layer 160 is formed on the activated metal layer 152. In the present embodiment, the second metal seed layer 160 is formed on the activated metal layer 151 by electro-less copper plating, such that an electrical conductivity between the activated metal layer 152 and the first metal seed layer 130 is improved.

Figure 8:
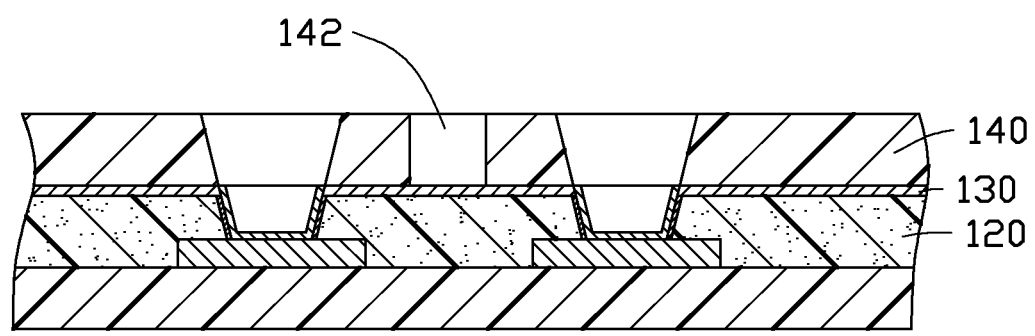
FIG. 8 shows a trace opening formed by removing the trace portion of the photoresist layer of FIG. 6.

FIG. 8 shows step 7, in which the trace portion 141 is removed by developing, thereby, a trace opening 142 is defined. Portion of first metal seed layer 130 is exposed from the trace openings 142.

Figure 9:
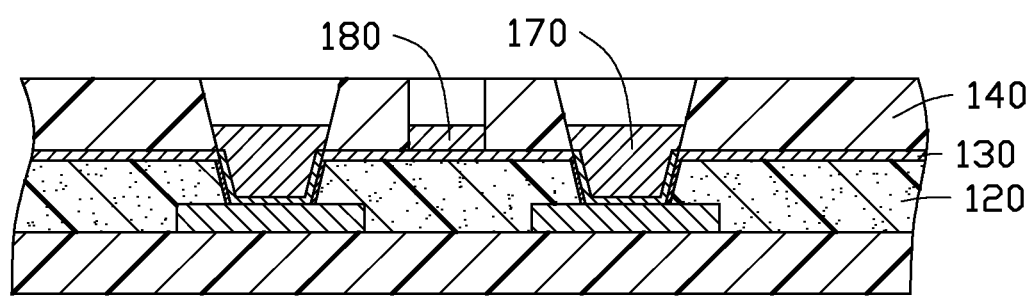
FIG. 9 shows a metal bump formed in each blind vias and conductive trace formed in trace opening of FIG. 7.

FIG. 9 shows step 8, in which each metal bump 170 is formed in each blind via 151 and traces 180 are formed in the trace openings 142. In the present embodiment, the metal bumps 170 and the traces 180 are formed in by electroplating. Because the activated metal layer 152 electrically connects the first metal seed layer 130 and the second metal seed layer 160, the metal bumps 170 can be formed in the blind via 151 by electroplating. Each metal bump 170 includes a bottom surface 171 and a top surface 172. The bottom surface 171 is in contact with a conductive pad 112. A distance between the bottom surface 171 and the top surface 172 of each metal elevation 170 is greater than a thickness of the dielectric layer 120.

Figure 10:
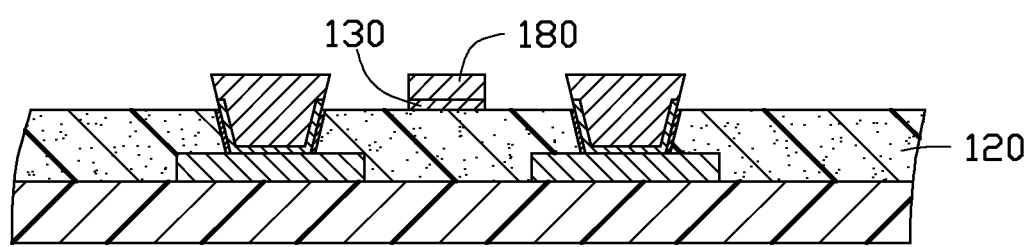
FIG. 10 shows the photoresist layer and the first metal seed layer removed from the circuit substrate of FIG. 9.

FIG. 10 shows step 9, the photoresist layer 140 and the first metal seed layer 130 uncovered by the traces 180 are removed. In the present embodiment, the photoresist layer 140 is removed from the first metal seed layer 130 using stripping solution. The stripping solution chemically reacts with the photoresist layer 140, such that the photoresist layer 140 is dissolved. Accordingly, the photoresist layer 140 is removed from the first metal seed layer 130. The first metal seed layer 130 uncovered by the traces 180 is removed from the dielectric layer 120 by micro-etching.

Figure 11:
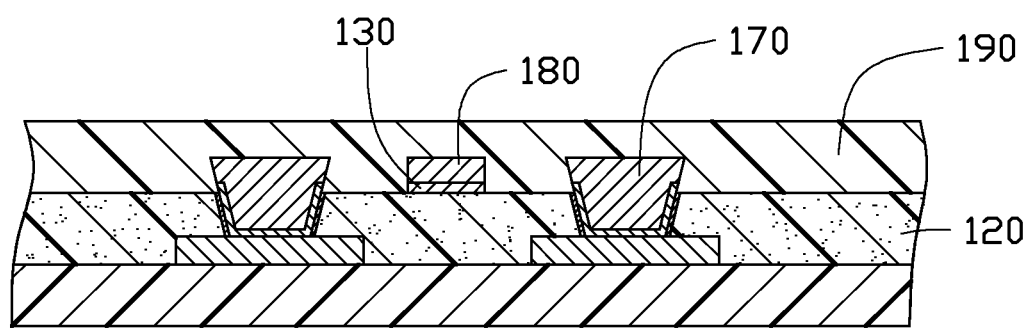
FIG. 11 shows a solder mask formed on the dielectric layer of FIG. 10.
Figure 12:
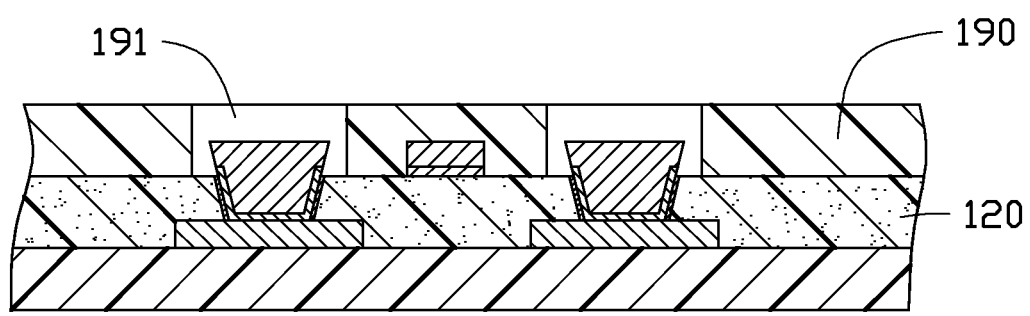
FIG. 12 shows holes corresponding to metal bumps formed in solder mask of FIG. 10.

FIGS. 11 and 12 show step 10, in which a solder mask 190 is formed on a surface of the dielectric layer 120, a surface of the metal bumps 170 and a surface of traces 180. A number of holes 191 are defined in the solder mask 190. Each hole 190 spatially corresponds to a metal bump 170. Each metal bump 170 is exposed from one hole 190.

In the present embodiment, the solder mask 190 is formed by printing solder mask ink, exposing the solder mask, and developing the solder mask. An area of cross section of each hole 190 is larger than an area of cross section of corresponding metal bump 170. The trace 180 is embedded in the solder mask 190.

Figure 13:
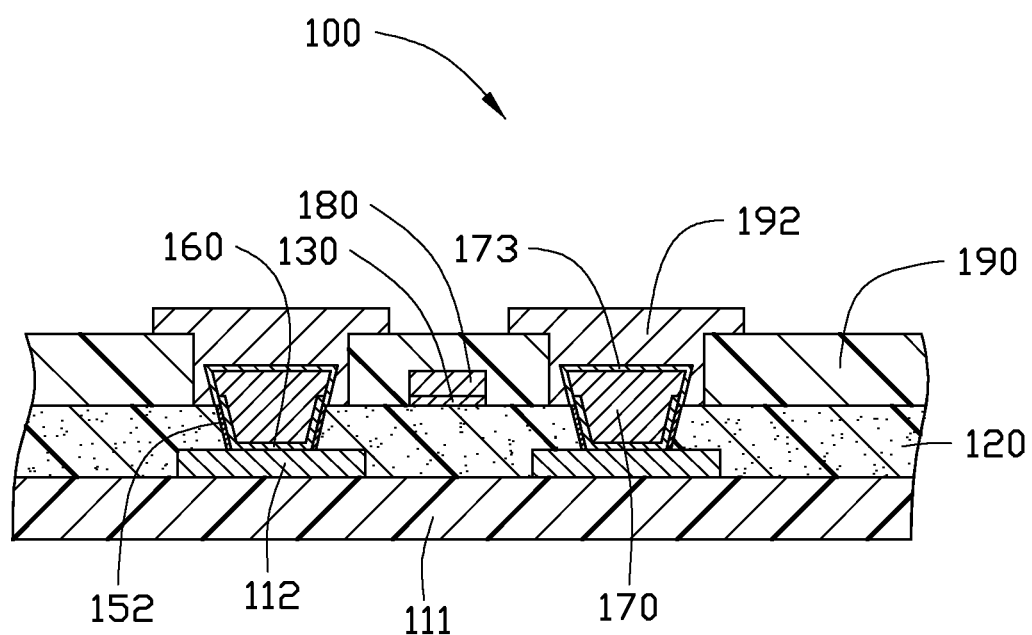
FIG. 13 shows a printed circuit board according to the exemplary embodiment.

FIG. 13 shows step 11, in which a surface treatment is applied to portions of the metal bumps 170, which protrude out of the dielectric layer 120, thereby obtaining a printed circuit board 100.

In the present embodiment, when the surface treatment is applied to portions of the metal bumps 170, a protection layer 173 is formed over a surface of the portion of each metal bump 170 which protrudes out of the dielectric layer 120, such that the surface of the portion of each metal bump 170 which protrudes out of the dielectric layer 120 is protected. A material of the protection layer 173 may be tin, lead, silver, gold, nickel, palladium, a single layer structure made of an alloy of such metals, or a multilayer structure made of a combination of such metals, for example. The protection layer 173 may be made of organic solderable preservative. When the protection layer 173 is made of metal, the protection layer 173 may be formed by electroplating. When the protection layer 173 is made of organic solderable preservative, the protection layer 173 may be formed chemically.

In the present embodiment, a solder 192 is filled in each hole 191. The solder 192 formed over a surface of the protection layer 173. Portion of each solder 192 protrudes out of the solder mask 190. A material of the solder 192 may be tin, lead or copper, also may be an alloy of such metals.

The printed circuit board 100 obtained by the above method includes the base 111, a number of conductive pads 112, the dielectric layer 120, the activated metal layer 152, the first metal seed layer 130, the second metal seed layer 160, the metal bumps 170, traces 180, and solder mask 190.

The conductive pads 112 are formed on the base 111. The conductive pads 112 arranged in an array.

The dielectric layer 120 is formed on the surface of the conductive pads 112 and the surface of the base 111 exposed from the conductive pads 112. The dielectric layer 120 is made of the ink includes a laser-activated catalyst. The laser-activated catalyst is converted into an electrically conductive material by laser irradiation, such that an electro-less copper plating process can be directly applied in the following step. A mass percent of the laser-activated catalyst in the solder resist ink is in a range from 0.1% to 30%, preferably from 0.5% to 10%. The laser-activated catalyst may be a heavy metal mixture oxide spinel, for example, copper-chromium oxide spinel. The laser-activated catalyst may be metal salt, for example, copper sulfate, copper hydroxide phosphate, or cupric rhodanate.

The printed circuit board 100 also includes a plurality of blind vias 151. The blind vias 151 spatially correspond to the conductive pads 112. Each blind via 151 passes through the dielectric layer 120. The activated metal layer 152 is formed in the inner sidewall of every blind via 151, and is in contact with the dielectric layer 120. The second metal seed layer 160 is formed on the activated metal layer 152 and the corresponding conductive pad 112. The first metal seed layer 130 is formed on a surface of the dielectric layer 120 furthest away from the base 111. The traces 180 formed on a surface of the first metal seed layer 130 furthest away from the dielectric layer 120.

The solder mask 190 is formed on a surface of the dielectric layer 120 and a surface of traces 180. The solder mask 190 includes a number of holes 191.

A portion of each metal bump 170 is in a blind via 151, and the other portion of each metal bump 170 protrudes from the blind via 151 and is in one hole 191. The portion of each metal bump 170 in the blind via 151 is in contact with the second metal seed layer 160.

In the present embodiment, the protection layer 173 is formed on the surface of the portion of the metal bump 170 which protrudes from the dielectrical layer 120. A material of the protection layer 173 may be tin, lead, silver, gold, nickel, palladium, a single layer structure made of an alloy of one of such metals, or a multilayer structure made of a combination of such metals, for example. The protection layer 173 may be made of organic solderable preservative. When the protection layer 173 is made of metal, the protection layer 173 may be formed by electroplating. When the protection layer 173 is made of organic solderable preservative, the protection layer 173 may be formed chemically.

In the method for manufacturing the printed circuit board 100, the blind via 151 is defined by a laser. Accordingly, there is no need to first define a plurality of larger openings in the dielectric layer by a first developing process and a plurality of larger openings in the photoresist layer by a second developing process, and there is no need to align the larger openings in the dielectric layer with the larger openings in the photoresist layer. Productivity of the printed circuit board 100 is thus higher. In addition, the dielectric layer 120 is made of a ink including a laser-activated catalyst. When the blind via 151 is defined by a laser, the laser-activated catalyst is at the wall of blind via 151, which is in the dielectric layer 120, and is activated to obtain the activated metal layer 152. Then, the second metal seed layer 160 can be easily obtained by electroplating. Further more, because the blind via 151 is precisely defined by a laser, the blind via 151 can be made smaller. A distribution density of the blind via 151 is greater, and a distribution density of the metal bump 170 is also greater.

While certain embodiments have been described and exemplified above, various other embodiments will be apparent from the foregoing disclosure to those skilled in the art. The disclosure is not limited to the particular embodiments described and exemplified but is capable of considerable variation and modification without departure from the scope and spirit of the appended claims.

What is claimed is:

1. A method for manufacturing a printed circuit board, comprising:
   providing a circuit substrate, the circuit substrate comprising a base and a plurality of conductive pads;
   forming a dielectric layer on a surface of the conductive pads and a surface of the base exposed from the conductive pads, the dielectric layer comprising a laser-activated catalyst;
   forming a first metal seed layer on a surface of the dielectric layer furthest from the circuit substrate;
   forming a photoresist layer on a surface of the first metal seed layer furthest from the dielectric layer, the photoresist layer comprising a trace portion;
   exposing the trace portion of the photoresist layer;
   defining a plurality of blind vias in the photoresist layer, the first metal seed layer, and the dielectric layer using a laser, the blind vias spatially corresponding to the conductive pads, each conductive pad exposed from a corresponding blind via, the laser-activated catalyst at a wall of the blind via being activated by laser, thereby obtaining an activated metal layer;
   forming a second metal seed layer on the activated metal layer, the second metal seed layer being electrically connected to the first metal seed layer;
   removing the trace portion of the photoresist layer by developing to form a trace opening, and a portion of the first metal seed layer being exposed from the trace opening;
   forming a metal bump in each blind via and forming a trace in the trace opening by electroplating, the metal bump protruding the surface of the dielectric layer furthest from the circuit substrate; and
   removing the first metal seed layer uncovered by the trace and the photoresist layer, thereby obtaining a printed circuit board.

2. The method of claim 1, wherein the dielectric layer is formed by printing an ink, exposing the ink, and developing the ink, and the ink comprises the laser-activated catalyst.

3. The method of claim 2, wherein a mass percent of the laser-activated catalyst in the ink is in a range from 0.1% to 30%.

4. The method of claim 3, wherein the laser-activated catalyst is a heavy metal mixture oxide spinel or metal salt.

5. The method of claim 4, wherein the laser-activated catalyst is copper-chromium oxide spinel, copper sulfate, copper hydroxide phosphate, or cupric rhodanate.

6. The method of claim 1, wherein the second metal seed layer is formed by electro-less copper plating.

7. The method of claim 6, further comprising a step of forming a protection layer on a surface of each metal bump protruding the dielectric layer.

8. The method of claim 1, further comprising forming a solder mask on the surface of the dielectric layer and a surface of the trace, a plurality of holes corresponding to the metal bumps defined in the solder mask, a portion of the metal bump protruding from the blind via being exposed from each corresponding hole.

9. The method of claim 8, wherein an area of cross section of each hole is larger than an area of cross section of the metal bump in the corresponding hole.

\* \* \* \* \*